United States Patent
Hotellier et al.

(10) Patent No.: US 9,648,724 B2
(45) Date of Patent: May 9, 2017

(54) ELECTRONIC DEVICE WITH HOLLOWED-OUT REAR PLATE

(71) Applicants: STMICROELECTRONICS (CROLLES 2) SAS, Crolles (FR); STMICROELECTRONICS SA, Montrouge (FR)

(72) Inventors: Nicolas Hotellier, Jarrie (FR); François Guyader, Montbonnot (FR); Vincent Fiori, Grenoble (FR); Richard Fournel, Lumbin (FR); Frédéric Gianesello, Saint Pierre d'Albigny (FR)

(73) Assignees: STMICROELECTRONICS (CROLLES 2) SAS, Crolles (FR); STMICROELECTRONICS SA, Montrouge (FR)

(*) Notice: Subject to any disclaimer, the term of this patent is extended or adjusted under 35 U.S.C. 154(b) by 0 days.

(21) Appl. No.: 14/956,512

(22) Filed: Dec. 2, 2015

(65) Prior Publication Data
US 2016/0366758 A1 Dec. 15, 2016

(30) Foreign Application Priority Data
Jun. 12, 2015 (FR) .................... 15 55362

(51) Int. Cl.
*H05K 1/02* (2006.01)
*H05K 1/11* (2006.01)
(Continued)

(52) U.S. Cl.
CPC ......... *H05K 1/0216* (2013.01); *H01L 21/762* (2013.01); *H01L 21/764* (2013.01);
(Continued)

(58) Field of Classification Search
CPC ...... H05K 1/0216; H05K 1/111; H05K 1/181; H05K 3/0011; H01L 21/764; H01L 21/762; H01L 21/7624
See application file for complete search history.

(56) References Cited

U.S. PATENT DOCUMENTS

| 5,404,273 A * | 4/1995 | Akagawa ............. H01L 23/057 174/538 |
| 2002/0011907 A1 * | 1/2002 | Yamada ............. H01L 23/5385 333/204 |

(Continued)

OTHER PUBLICATIONS

Yokomatsu et al., "Novel honeycomb SOI structure with low parasitic capacitance for human-sensing accelerometer", 2012 Fifth International Conference on Emerging Trend in Engineering & Technology, IEEE, Nov. 2012, pp. 70-74.

(Continued)

*Primary Examiner* — Hoa C Nguyen
(74) *Attorney, Agent, or Firm* — Slater Matsil, LLP

(57) ABSTRACT

An electronic device has a rear plate that includes a substrate rear layer, a substrate front layer and a dielectric intermediate layer between the substrate rear and front layers. An electronic structure is on the substrate front layer and includes electronic components and electrical connections. The substrate rear layer includes a solid local region and a hollowed-out local region. The hollowed-out local region extends over all of the substrate rear layer. The substrate rear layer does not cover at least one local zone of the dielectric intermediate layer corresponding to the hollowed-out local region.

22 Claims, 5 Drawing Sheets

(51) Int. Cl.
   *H05K 1/18*      (2006.01)
   *H05K 3/00*      (2006.01)
   *H01L 21/762*    (2006.01)
   *H01L 21/764*    (2006.01)
(52) U.S. Cl.
   CPC .......... *H01L 21/7624* (2013.01); *H05K 1/111* (2013.01); *H05K 1/181* (2013.01); *H05K 3/0011* (2013.01)

(56) References Cited

U.S. PATENT DOCUMENTS

| | | |
|---|---|---|
| 2003/0067014 A1 | 4/2003 | Tsuruta et al. |
| 2003/0107056 A1* | 6/2003 | Chin .................. H01L 23/5383 257/211 |
| 2007/0066126 A1* | 3/2007 | Dutta .................... H05K 1/024 439/493 |
| 2007/0086695 A1* | 4/2007 | Hsu ........................ H01L 23/48 385/14 |
| 2013/0170167 A1* | 7/2013 | Miyazaki .......... H01L 23/49822 361/783 |
| 2015/0325572 A1* | 11/2015 | Cheng .................. H01L 21/762 257/369 |
| 2015/0346248 A1* | 12/2015 | Curtis .................... G01R 21/00 174/70 R |

OTHER PUBLICATIONS

Tombak et al., Cellular antenna switches for multimode applications based on a silicon-on-insulator (S-O-I) technology, IEEE RFIC, 2010, pp. 1-20.

Neve et al., "Impact of Si substrate resistivity on the non-linear behaviour of RF CPW transmission lines", Proceedings of the 3rd European Microwave Integrated Circuits Conference, Amsterdam, The Netherlands, Oct. 2008, pp. 36-39.

* cited by examiner

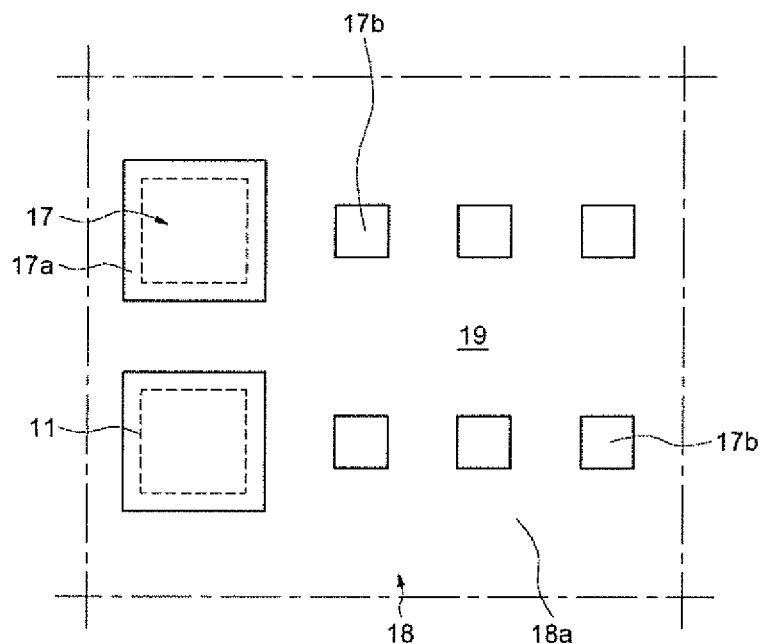
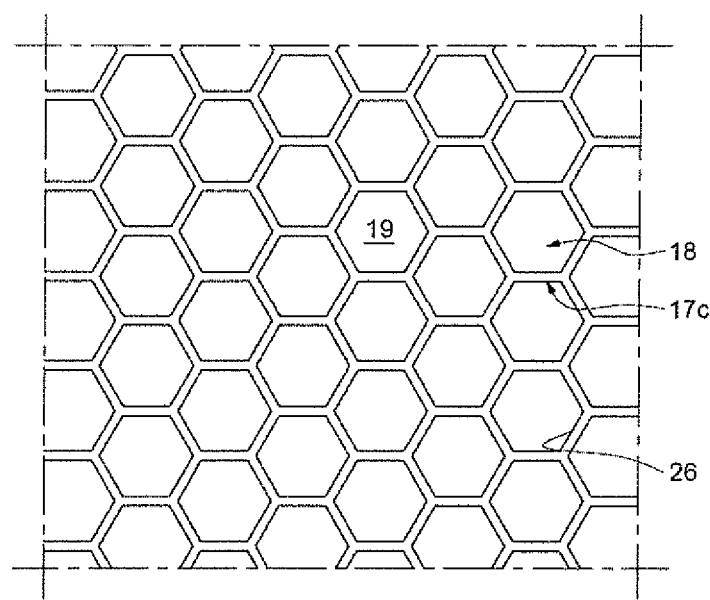

ELECTRONIC DEVICE WITH HOLLOWED-OUT REAR PLATE

FIELD OF THE INVENTION

The present invention relates to the field of electronic devices.

BACKGROUND

Some electronic devices comprise a plate that includes a substrate thick rear layer, a substrate thin front layer and a dielectric thin intermediate layer between the rear and front layers. An electronic structure is on the substrate front layer and includes electronic components and electrical connections.

Generally, the substrate is made of silicon and the buried dielectric intermediate layer is made of silicon dioxide. The buried dielectric intermediate layer is obtained by ion implantation.

In such electronic devices, a capacitive coupling exists between the rear layer and the electronic structure. This capacitive coupling gives rise to operating disturbances of the electronic structure, especially when the electronic structure uses oscillating signals.

SUMMARY

An electronic device comprises a rear plate that includes a substrate rear layer, a substrate front layer and a dielectric intermediate layer between the substrate rear and front layers. An electronic structure may be on the substrate front layer. The electronic structure may include electronic components and electrical connections.

The substrate rear layer may include at least one solid local region and at least one hollowed-out local region. The hollowed-out local region may be over the whole or entire thickness of the rear layer, so that the substrate rear layer does not cover at least one local zone of the rear face of the dielectric intermediate layer. The at least one local zone corresponds to the hollowed-out local region. Thus, unwanted capacitive couplings between the rear layer and the electronic structure are advantageously limited.

The solid local region may extend, in the direction of the thickness of the substrate plate, in correspondence, at least in part, with at least one exterior electrical contact front pad of the electronic structure.

The hollowed-out local region may extend, in the direction of the thickness of the substrate plate, in correspondence, at least in part, with at least one electronic component of the electronic structure.

The hollowed-out local region may be at least in part filled with at least one dielectric filling material. The dielectric filling material may exhibit a rear face in a plane of a rear face of the rear plate. The dielectric filling material may cover a rear face of the solid region, and exhibit a rear face parallel to the rear face of the rear plate.

An intermediate layer may be interposed between the dielectric filling material and the rear plate. The solid local region may comprise a plurality of pillars and/or a honeycomb-shaped partitioning.

Another aspect is directed to a method of making an electronic device comprising a plate including a substrate rear layer, a substrate front layer and a dielectric intermediate layer between the rear and front layers. An electronic structure is on the substrate front layer and includes electronic components and electrical connections. The electrical connections may include at least one exterior electrical contact front pad.

The method may comprise locally removing, down to the intermediate layer, the material of the rear layer so as to create at least one hollowed-out local region devoid of material of this rear layer and so that at least one solid local region is left. The solid local region may extend, in the direction of the thickness of the substrate plate, in correspondence, at least in part, with at least one front exterior electrical contact pad of the electronic structure. The hollowed-out local region may extend, in the direction of the thickness of the substrate plate, in correspondence, at least in part, with at least one electronic component of the electronic structure.

The method may further comprise at least partly filling the hollowed-out local region with at least one dielectric filling material.

BRIEF DESCRIPTION OF THE DRAWINGS

An electronic device and a corresponding method of making will now be described by way of nonlimiting exemplary embodiments, illustrated by the drawings in which:

FIG. 9 represents a rear view of the electronic device of FIG. 8; and

FIG. 10 represents a rear view of the electronic device of FIG. 1, according to another method variation.

DETAILED DESCRIPTION

Figure 1:
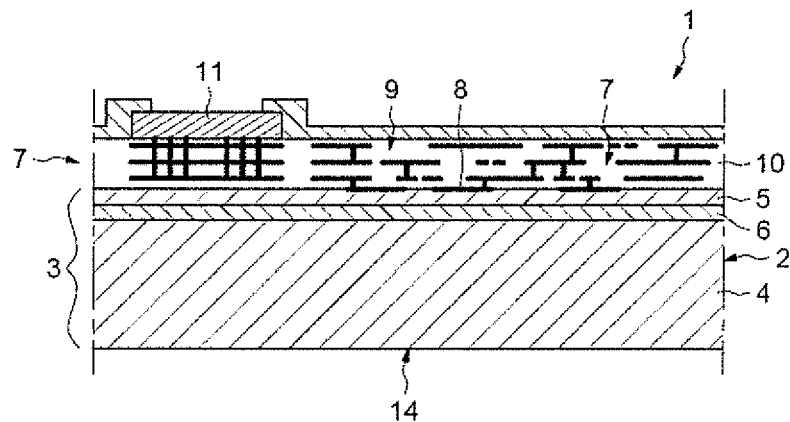
FIG. 1 represents a partial section through an electronic device, in an initial state.

In FIG. 1 a portion of an electronic device 1 in an initial state is illustrated. The electronic device 1 generally includes a wafer 2 comprising a plurality of adjacent electronic devices which will subsequently be individually sliced from the wafer.

The electronic device 1 comprises a rear plate 3 including a substrate rear layer 4, a thin substrate front layer 5 and a dielectric thin intermediate layer 6 between the rear and front layer.

The plate 3 is made of silicon and the buried, dielectric intermediate layer 6 is made of silicon dioxide. The intermediate layer 6 may be obtained by a depth-wise ion implantation in the rear plate 3.

The electronic device 1 furthermore comprises an electronic structure 7 produced on the substrate front layer 5. The electronic structure 7 comprises a plurality of electronic components 8 produced on the substrate front layer 5, and an electrical connection network 9 formed as a layer 10 on several metal levels.

The electrical connection network 9 comprises, in a last metal level, a plurality of front pads 11 for exterior electrical contact. The electronic components 8 can be transistors, switches, electrical resistors, diodes, memories, capacitors or other electronic components.

Generally, the electronic components 8 are placed in the mid-zone of the electronic device 1 and the front pads 11 are placed in a peripheral zone between this mid-zone and the edge of the electronic device 1. Nonetheless, front pads 9 can be placed in the mid-zone of the electronic device 1, preferably without there being any components beneath these pads.

Figure 2:
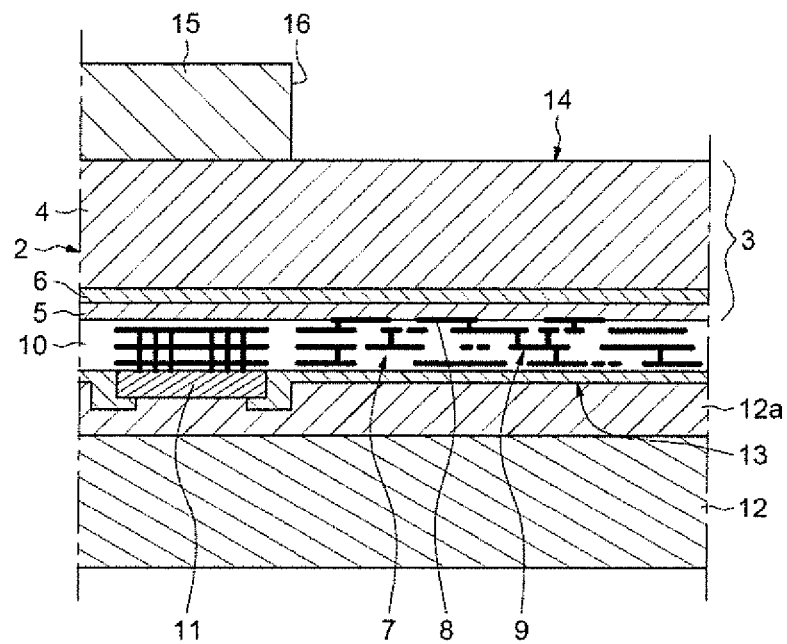
FIG. 2 represents a section through the electronic device of FIG. 1, according to a method step.

A treatment or method that will be applied to the electronic device 1 will now be described. As illustrated in FIG. 2, the electronic device 1 is mounted on a support wafer 12. This is done by fixing in a temporary manner the front face 13 of the electronic structure 9 onto the support wafer 12 by way of a glue layer 12a.

Next, by photolithography, a mask 15 which thus, for example, exhibits one or more through openings 16, is produced on the rear face 14 of the electrical device 1. In other words, on a rear face of the substrate rear layer 4 of the rear plate 3.

Figure 3:
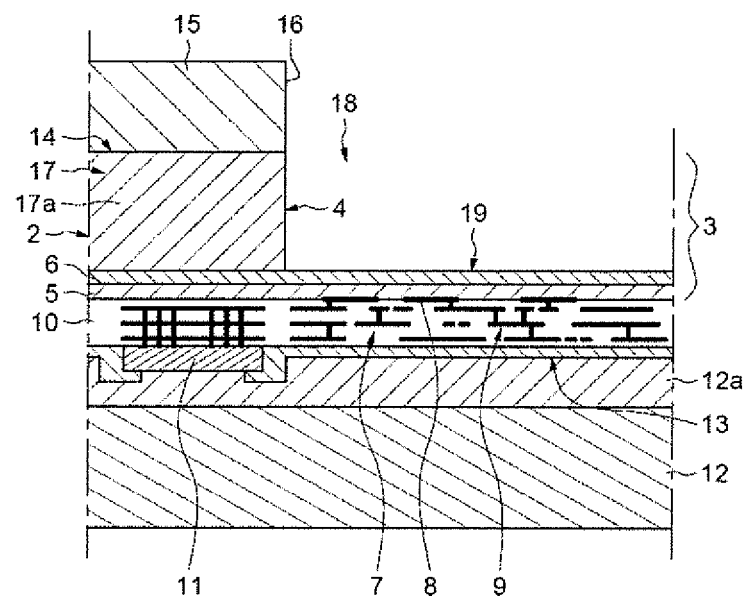
FIG. 3 represents a section through the electronic device of FIG. 1, according to another method step.

Next, as illustrated in FIG. 3, a chemical attack or treatment of the substrate rear layer 4 is undertaken through the openings 16 of the mask 15, down to the dielectric intermediate layer 6. The latter forming a barrier to treat.

It follows from this that the substrate rear layer 4 then comprises one or more solid local regions 17 and one or more hollowed-out local regions 18. Each hollowed-out local region 18 may be fashioned over the whole or entire thickness of the substrate rear layer 4. In regard to the surface of the electronic device 1, the solid local region or regions 17 and the hollowed-out local region or regions 18 are complementary.

In this way, the substrate rear layer 4 thus hollowed out no longer covers one or more local zones 19 of the rear face of the dielectric intermediate layer 6. This corresponds to the hollowed-out local region or regions 18.

Figure 4:
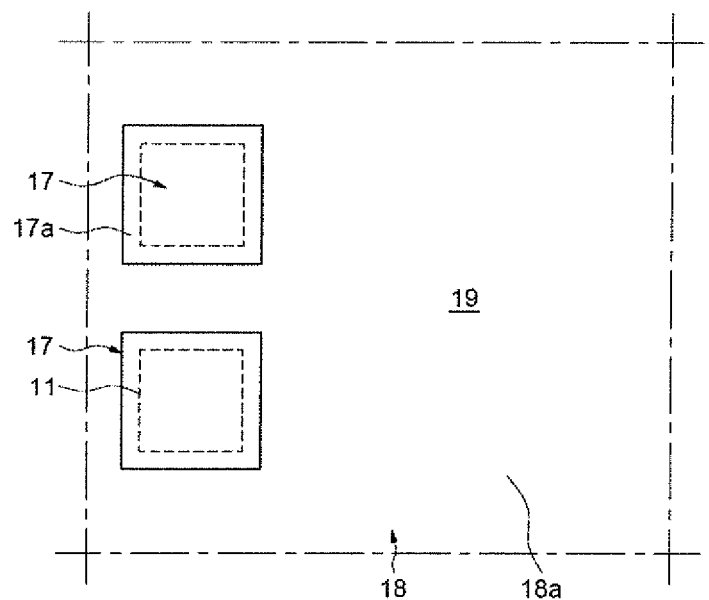
FIG. 4 represents a rear view of the electronic device of FIG. 3.

According to an exemplary embodiment illustrated in FIGS. 3 and 4, the substrate rear layer 4 exhibits a plurality of solid local regions 17a extending or left, in the direction of the thickness of the substrate rear plate 3, respectively in correspondence with the front pads 11 of the electronic structure 7. For example, the surface covered by the solid local regions 17a is larger than the surface covered by the front pads 11 and overhangs all around.

According to a variation, several front pads 11 could be situated in correspondence with a solid local region 17a of the substrate rear layer 4.

The substrate rear layer 4 exhibits a hollowed-out local region 18a which extends over the whole of the remainder of the surface of the dielectric intermediate layer 6. More precisely, the hollowed-out local region 18a extends, in the direction of the thickness of the substrate plate 3, in correspondence at least with the zone in which the electronic components 9 of the electronic structure 7 are situated, and preferably over a larger surface.

Thus, the electronic components 9 are not subjected, or are subjected in a limited manner, to capacitive couplings with the material of the hollowed-out dielectric rear layer 4.

It is then possible to undertake the removal of the mask 15, of the support wafer 12 and of the glue layer 12a. It is possible to leave the electronic device 1 for its subsequent use. The remaining part of the rear face 14, formed by the rear faces of the solid local regions 17a, forms a surface for mounting on a support.

Nonetheless, having removed just the mask 15, it is possible to undertake a filling of the hollowed-out local region 18a of the rear layer 4 with dielectric material. The filling may be accomplished in several ways.

Figure 5:
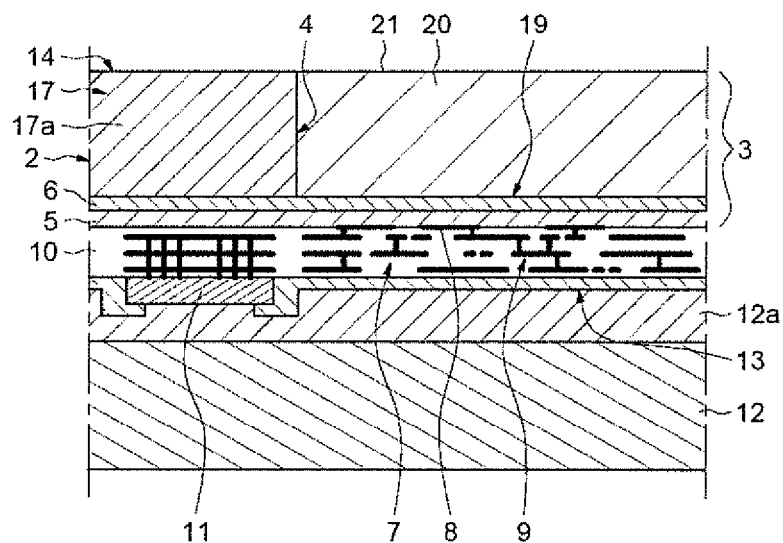
FIG. 5 represents a section through the electronic device of FIG. 1, according to another method step.

As illustrated in FIG. 5, it is possible to fill just the hollowed-out local region 18a of the rear layer 4 with a dielectric material. The dielectric layer, for example, may be based on a polymer, so that this filling 20 exhibits a rear face 21 extending in the plane of the rear face 14 of the hollowed-out rear layer 4. Thus, the electronic device 1 is strengthened and a surface for mounting the electronic device 1 on a definitive support is formed by the rear faces of the solid local regions 17a and by the rear face 21 of the filling 20.

Figure 6:
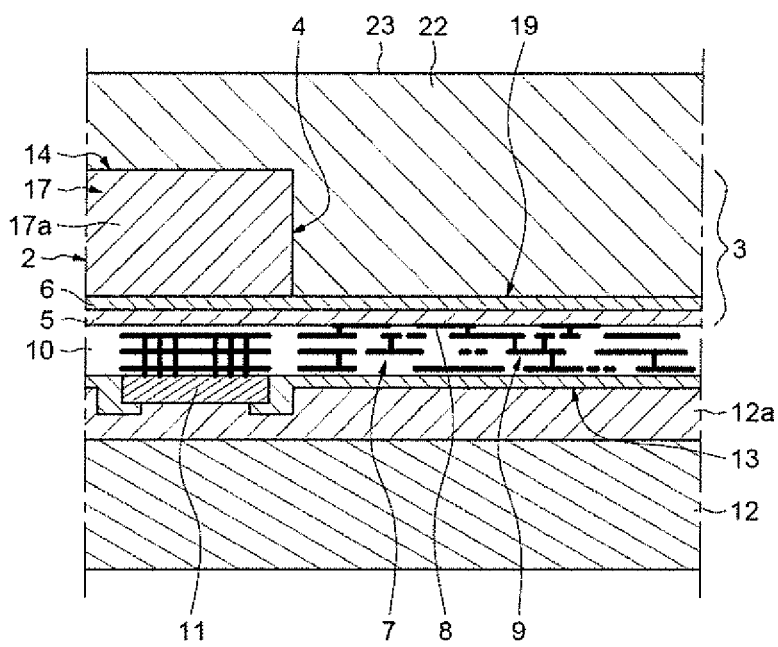
FIG. 6 represents a section through the electronic device of FIG. 1, according to another method step.

As illustrated in FIG. 6, it is possible to fill just the hollowed-out local region 18a of the rear layer 4 with a dielectric material and a material layer is formed on the rear face of the solid local regions 17a. This filling 22 exhibits a rear face 23 extending in the plane situated at the rear of and parallel to the rear face 14 of the hollowed-out rear layer 4. Thus, a surface for mounting the electronic device 1 on a definitive support is formed by the rear face 23 of the filling 22.

Figure 7:
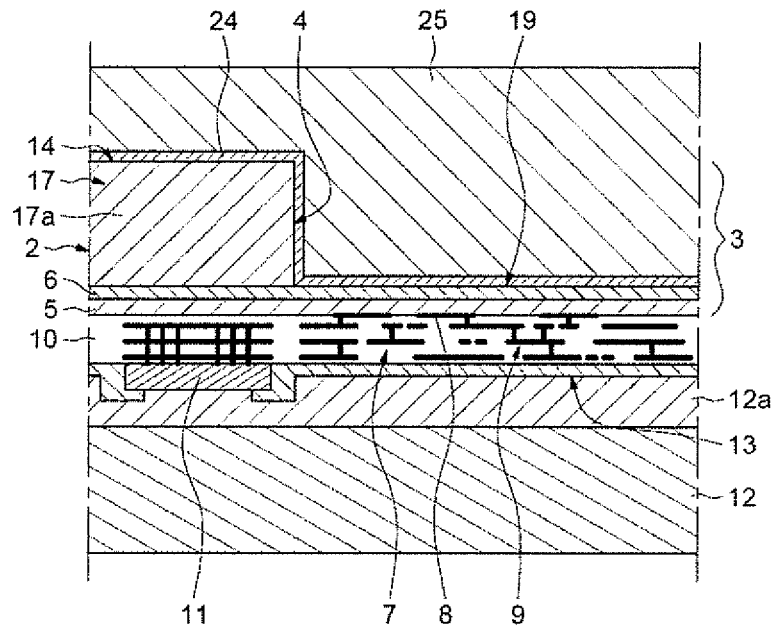
FIG. 7 represents a section through the electronic device of FIG. 1, according to another method step.

As illustrated in FIG. 7, a sub-layer 24 of a first dielectric material may first be formed on the zone 19 of the dielectric intermediate layer 6, on the flanks or sides and on the rear surface of the solid local regions 17a. Then, on the sub-layer 24, a filling 25 of a second dielectric material may be formed, for example such as described with reference to FIG. 6. Advantageously, the first dielectric material exhibits a lower dielectric constant than the dielectric constant of the second dielectric material.

The fillings described above can be obtained by spreading, by smearing, by centrifugation or by lamination of a film.

Figure 8:
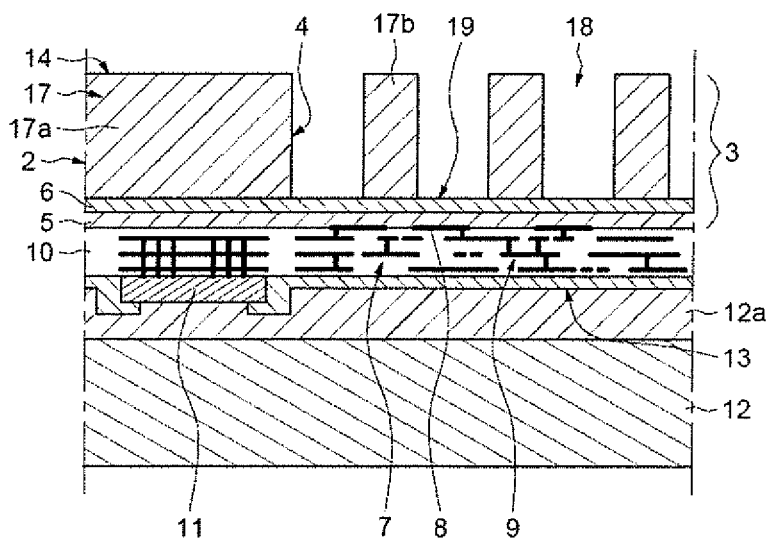
FIG. 8 represents a section through the electronic device of FIG. 1, according to a method variation.

According to another exemplary embodiment illustrated in FIGS. 8 and 9, the operation of attacking or treating the rear layer 4 can be such that the hollowed-out, rear layer 4 exhibits not only the local solid regions 17a but also a plurality of auxiliary solid local regions 17b forming strengthening pillars. These may be placed, for example, facing the zone covered by the electronic components 9. This is done while taking care that, preferably, no pillar is placed in correspondence, in the direction of the thickness of the electronic device 1, with one or more electrical components that are most sensitive to capacitive coupling with the material of the substrate rear layer 4.

According to a variation illustrated in FIG. 10, the operation of attacking the rear layer 4 can be such that this hollowed-out, rear layer 4 exhibits, totally or over at least one region, optionally in combination with at least one of the variations described previously, a solid local region 17c comprising a honeycomb-shaped partitioning. The cells 26 of this partitioning, which locally uncover the dielectric intermediate layer 6, form a hollowed-out local region 18.

After which, it is possible to carry out a filling of the hollowed-out local region 18 of the rear layer 4. This may be accomplished in a manner equivalent to what was described previously with reference to FIGS. 4, 5 and 6.

It results from the foregoing that, while being protected against capacitive couplings with the material of the hollowed-out dielectric rear layer 4, the electronic device 1 can exhibit mechanical resistance characteristics suitable for supporting pressures on the contact pads 11 while electrical connections, such as electrical wires, are being put in place on these pads.

That which is claimed is:

1. An electronic device comprising:
   a rear plate comprising a substrate rear layer, a substrate front layer and a dielectric intermediate layer between said substrate rear and front layers;
   an electronic structure on the substrate front layer and comprising electronic components and electrical connections; and
   said substrate rear layer including at least one solid local region and at least one hollowed-out local region, with the at least one hollowed-out local region extending over an entire thickness of said substrate rear layer so that said substrate rear layer does not cover at least one local zone of a rear face of said dielectric intermediate layer, with the at least one local zone corresponding to the at least one hollowed-out local region.

2. The electronic device according to claim 1, wherein said electronic structure comprises at least one external electrical contact pad; and wherein said at least one solid local region extends over an entire thickness of said rear plate and overlies said at least one external electrical contact pad.

3. The electronic device according to claim 1, wherein said at least one hollowed-out local region overlies at least one of said electronic components of said electronic structure.

4. The electronic device according to claim 1, further comprising at least one dielectric filling material filling said at least one hollowed-out local region.

5. The electronic device according to claim 4, wherein said at least one solid local region has a rear face; and wherein said at least one dielectric filling material has a rear face aligned with the rear face of said at least one solid local region.

6. The electronic device according to claim 4, wherein said at least one solid local region has a rear face; wherein said dielectric filling material covers the rear face of said at least one solid region; and wherein said dielectric filling material has a rear face parallel to the rear face of said at least one solid local region.

7. The electronic device according to claim 4, further comprising an intermediate layer between said at least one dielectric filling material and said at least one solid local region and said dielectric intermediate layer.

8. The electronic device according to claim 1, wherein said at least one solid local region comprises at least one of a plurality of pillars and a honeycomb-shaped partitioning.

9. An electronic device comprising:
   a rear plate comprising a substrate rear layer, a substrate front layer and a dielectric intermediate layer between said substrate rear and front layers;
   an electronic structure on the substrate front layer, said electronic structure comprising at least one external electrical contact pad, electronic components and electrical connections; and
   said substrate rear layer including at least one solid local region and at least one hollowed-out local region,
      with the at least one hollowed-out local region extending over an entire thickness of said substrate rear layer so that said substrate rear layer does not cover at least one local zone of said dielectric intermediate layer, the at least one hollowed-out local region overlying at least one of said electronic components, and
      with said at least one solid local region extending over an entire thickness of said rear plate and overlying said at least one external electrical contact pad.

10. The electronic device according to claim 9, further comprising at least one dielectric filling material filling said at least one hollowed-out local region.

11. The electronic device according to claim 10, wherein said at least one solid local region has a rear face; and wherein said at least one dielectric filling material has a rear face aligned with the rear face of said at least one solid local region.

12. The electronic device according to claim 10, wherein said at least one solid local region has a rear face; wherein said dielectric filling material covers the rear face of said at least one solid region; and wherein said dielectric filling material has a rear face parallel to the rear face of said at least one solid local region.

13. The electronic device according to claim 10, further comprising an intermediate layer between said at least one dielectric filling material and said at least one solid local region and said dielectric intermediate layer.

14. The electronic device according to claim 9, wherein said at least one solid local region comprises at least one of a plurality of pillars and a honeycomb-shaped partitioning.

15. A method of making an electronic device, the method comprising:
   providing a plate including a substrate rear layer, a substrate front layer and a dielectric intermediate layer between the substrate rear and front layers, and an electronic structure on the substrate front layer comprising electronic components and electrical connections;
   removing, down to the dielectric intermediate layer, a portion of the substrate rear layer so as to define at least one hollowed-out local region and at least one solid local region; and
   wherein the at least one hollowed-out local region extends over an entire thickness of the substrate rear layer so that the substrate rear layer does not cover at least one local zone of a rear face of the dielectric intermediate layer, with the at least one local zone corresponding to the at least one hollowed-out local region.

16. The method according to claim 15, wherein the electronic structure comprises at least one external electrical contact pad; and wherein the at least one solid local region extends over an entire thickness of the rear plate and overlies the at least one external electrical contact pad.

17. The method according to claim 15, wherein the at least one hollowed-out local region overlies at least one of the electronic components of the electronic structure.

18. The method according to claim 15, further comprising filling the at least one hollowed-out local region with at least one dielectric filling material filling.

19. The method according to claim 18, wherein the at least one solid local region has a rear face; and wherein the at least one dielectric filling material has a rear face aligned with the rear face of the at least one solid local region.

20. The method according to claim 18, wherein the at least one solid local region has a rear face; wherein the dielectric filling material covers the rear face of the at least one solid region; and wherein the dielectric filling material has a rear face parallel to the rear face of the at least one solid local region.

21. The method according to claim 18, further comprising forming an intermediate layer between the at least one dielectric filling material and the at least one solid local region and the dielectric intermediate layer.

22. The method according to claim 15, wherein the at least one solid local region comprises at least one of a plurality of pillars and a honeycomb-shaped partitioning.

\* \* \* \* \*